United States Patent
Army, Jr. et al.

(10) Patent No.: US 9,988,973 B2
(45) Date of Patent: Jun. 5, 2018

(54) WATER INJECTOR FOR AVIATION COOLING SYSTEM

(71) Applicant: HAMILTON SUNDSTRAND CORPORATION, Windsor Locks, CT (US)

(72) Inventors: Donald E. Army, Jr., Enfield, CT (US); Patrick McCord, Norwich, CT (US)

(73) Assignee: HAMILTON SUNDSTRAND CORPORATION, Windsor Locks, CT (US)

( * ) Notice: Subject to any disclaimer, the term of this patent is extended or adjusted under 35 U.S.C. 154(b) by 275 days.

(21) Appl. No.: 14/590,558

(22) Filed: Jan. 6, 2015

(65) Prior Publication Data

US 2016/0195004 A1   Jul. 7, 2016

(51) Int. Cl.
| | |
|---|---|
| *B05B 1/32* | (2006.01) |
| *F02B 29/04* | (2006.01) |
| *H05K 7/20* | (2006.01) |
| *B05B 1/02* | (2006.01) |
| *B64D 13/08* | (2006.01) |
| *B05B 15/00* | (2018.01) |
| *B05B 15/06* | (2006.01) |
| *F24F 6/14* | (2006.01) |

(52) U.S. Cl.
CPC ........... *F02B 29/0462* (2013.01); *B05B 1/02* (2013.01); *B64D 13/08* (2013.01); *H05K 7/20345* (2013.01); *H05K 7/20881* (2013.01); *B05B 15/008* (2013.01); *B05B 15/061* (2013.01); *F24F 2006/146* (2013.01)

(58) Field of Classification Search
CPC ......... A62C 35/08; A62C 35/60; A62C 35/68; A62C 3/002; A62C 35/64; B05B 1/02; B05B 15/08; B05B 15/061; H05K 7/20345; H05K 7/20881
USPC .......................... 169/16, 17, 53, 14; 239/541
See application file for complete search history.

(56) References Cited

U.S. PATENT DOCUMENTS 3,101,918 A   8/1963   Evelyn et al.
3,878,692 A   4/1975   Steves
(Continued)

FOREIGN PATENT DOCUMENTS

| CN | 202667021 U | 1/2013 |
|---|---|---|
| EP | 0035909 A2 | 9/1981 |
| GB | 753194 A | 7/1956 |

OTHER PUBLICATIONS

European Search Report for Application No. 16150146.5-1760 dated Jun. 7, 2016; 7 pages.

*Primary Examiner* — Davis Hwu
(74) *Attorney, Agent, or Firm* — Cantor Colburn LLP

(57) ABSTRACT

A water injector for an aviation cooling system includes a body having a first end, a second end, and an intermediate portion extending therebetween. A conduit extends through the body from the first end to the second end. A spray nozzle is fluidically connected to the conduit and arranged at one of the first end and the second end. A mounting plate is arranged at the other of the first end and the second end. The mounting plate is configured and disposed to secure the body to an aviation cooling component. A filter is supported at the body and is fluidically exposed to the conduit. The filter is configured and disposed to capture particulate flowing into the water injector towards the spray nozzle.

3 Claims, 2 Drawing Sheets

(56) References Cited

U.S. PATENT DOCUMENTS

| | | | |
|---|---|---|---|
| 4,272,014 A | 6/1981 | Halfpenny et al. | |
| 4,323,191 A | 4/1982 | Chiyoda et al. | |
| 4,829,775 A | 5/1989 | Defrancesco | |
| 5,261,243 A | 11/1993 | Dunsmore | |
| 5,299,763 A | 4/1994 | Bescoby et al. | |
| 6,065,301 A | 5/2000 | Akazawa | |
| 6,325,362 B1 | 12/2001 | Massey et al. | |
| 6,739,400 B2* | 5/2004 | Lessi | A62C 3/08 |
| | | | 169/43 |
| 6,921,047 B2 | 7/2005 | McColgan et al. | |
| 6,971,607 B2 | 12/2005 | McColgan et al. | |
| 7,523,622 B2 | 4/2009 | Zywiak et al. | |
| 8,608,106 B2 | 12/2013 | Baumgardt et al. | |
| 2003/0209613 A1* | 11/2003 | Miyauchi | B05B 7/02 |
| | | | 239/418 |
| 2008/0083543 A1* | 4/2008 | Joo | A62C 31/05 |
| | | | 169/16 |
| 2009/0078794 A1 | 3/2009 | Cheng | |
| 2013/0118190 A1 | 5/2013 | Bruno et al. | |
| 2013/0160472 A1 | 6/2013 | Klimpel et al. | |
| 2013/0239598 A1 | 9/2013 | Barkowsky | |
| 2013/0273009 A1 | 10/2013 | Bridger et al. | |
| 2014/0116966 A1* | 5/2014 | Podsadowski | B01D 35/30 |
| | | | 210/791 |

* cited by examiner ns WATER INJECTOR FOR AVIATION
COOLING SYSTEM

BACKGROUND OF THE INVENTION

Exemplary embodiments pertain to the art of aviation cooling systems and, more particularly to a water injector for an aviation cooling system.

Many commercial/military aircraft include cooling systems that are designed to remove heat from various systems such as electronic components. Generally, the cooling systems include multiple components including a heat exchanger, a condenser, a water extractor, and a system for moving a coolant through the components. In some cases, water is channeled from the water extractor to the heat exchanger. The water is directed through an injector onto a surface of the heat exchanger to enhance cooling.

BRIEF DESCRIPTION OF THE INVENTION

Disclosed is a water injector for an aviation cooling system including a body having a first end, a second end, and an intermediate portion extending therebetween. A conduit extends through the body from the first end to the second end. A spray nozzle is fluidically connected to the conduit and arranged at one of the first end and the second end. A mounting plate is arranged at the other of the first end and the second end. The mounting plate is configured and disposed to secure the body to an aviation cooling component. A filter is supported at the body and fluidically exposed to the conduit. The filter is configured and disposed to capture particulate flowing into the water injector towards the spray nozzle.

Also disclosed is a ram air heat exchanger including a ram air outlet, a ram air header including a ram air inlet, and a water injector mounted to the ram air header. The water injector includes a body having a first end, a second end, and an intermediate portion extending therebetween. A conduit extends through the body from the first end to the second end. A spray nozzle is fluidically connected to the conduit and arranged at one of the first end and the second end. A mounting plate is arranged at the other of the first end and the second end. The mounting plate is configured and disposed to secure the body to an aviation cooling component. A filter is supported at the body and is fluidically exposed to the conduit. The filter is configured and disposed to capture particulate flowing into the water injector towards the spray nozzle.

BRIEF DESCRIPTION OF THE DRAWINGS

The following descriptions should not be considered limiting in any way. With reference to the accompanying drawings, like elements are numbered alike.

DETAILED DESCRIPTION OF THE INVENTION

A detailed description of one or more embodiments of the disclosed apparatus and method are presented herein by way of exemplification and not limitation with reference to the Figures.

Figure 1:
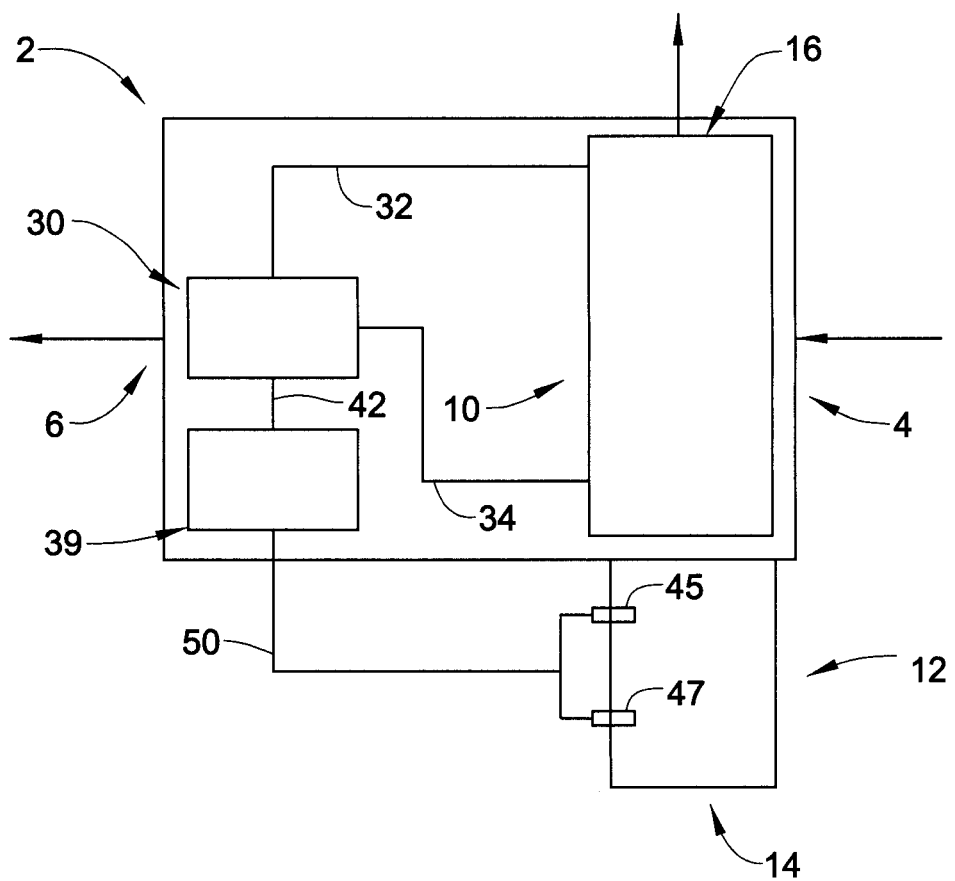
FIG. 1 is a schematic view of an aviation cooling system including a water injector, in accordance with an exemplary embodiment.

An aviation cooling system, in accordance with an exemplary embodiment, is illustrated generally at 2, in FIG. 1. Aviation cooling system 2 includes a bleed air inlet 4 and a conditioned air outlet 6. Aviation cooling system 2 may be employed in a commercial passenger aircraft, a military aircraft, or the like. As such, conditioned air outlet 6 could be directed towards one or more avionics systems. Of course, it should be understood that aviation cooling system 2 may be employed to condition other aviation components as well as cockpit and/or cabin air.

Aviation cooling system 2 includes a ram air heat exchanger 10 including a ram air header 12 having a ram air inlet 14. Ram air heat exchanger 10 also includes a ram air outlet 16. A condenser 30 is operatively connected to ram air heat exchanger 10 through a fluid line 32. Another fluid line 34 operatively connects condenser 30 back to ram air heat exchanger 10. A pump or compressor (not shown) may be fluidically connected to one of fluid lines 32 and 34 to circulate a coolant or refrigerant through aviation cooling system 2. Condenser 30 is also fluidically connected to a water collector 39 via a fluid line 42. Water collector 39 is fluidically connected to a first water injector 45 and a second water injector 47 via a fluid line 50. First and second water injectors 45 and 47 deliver jets of water onto ram air heat exchanger 10 to enhance conditioning of air passing into bleed air inlet 4.

Figure 2:
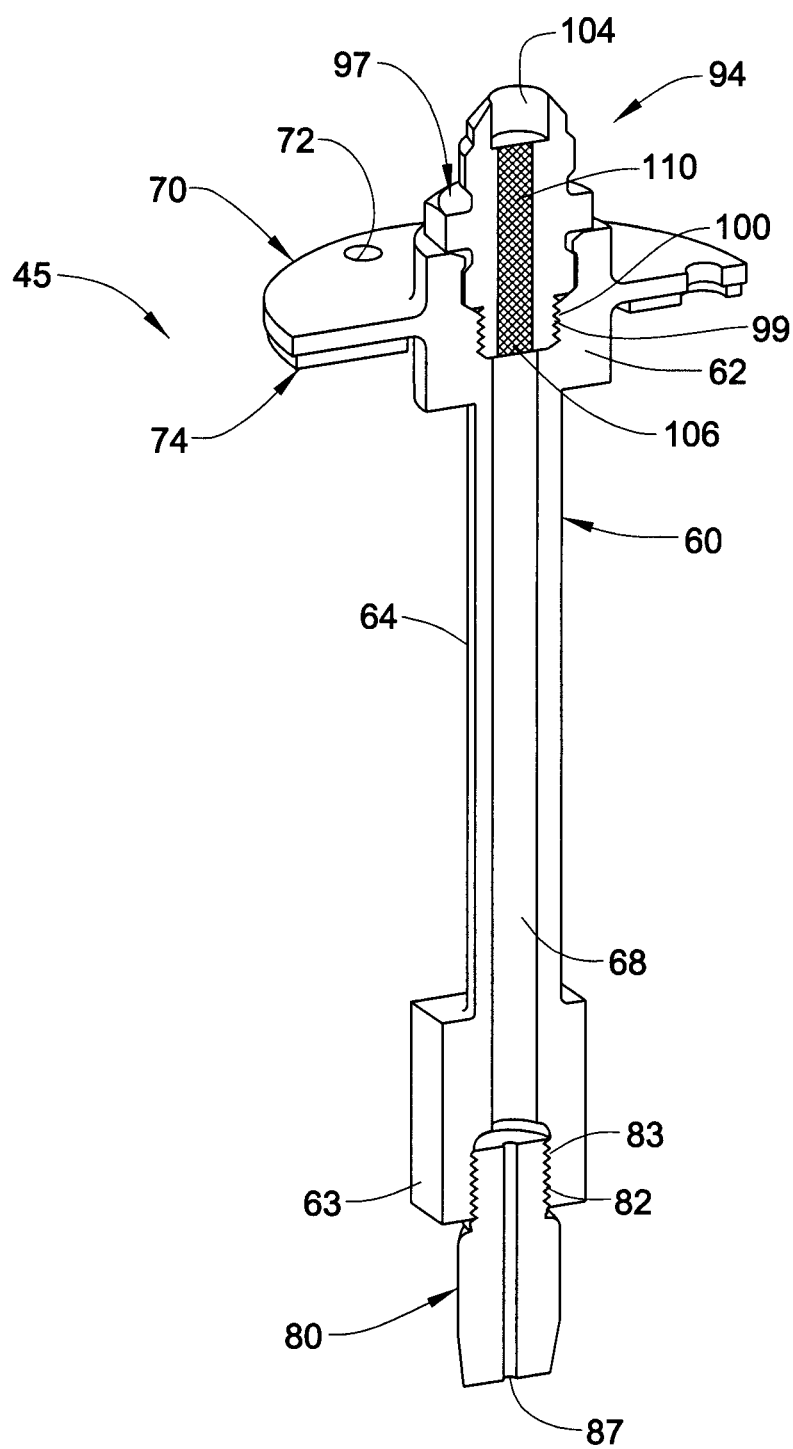
FIG. 2 is a partial cross-sectional view of the water injector of FIG. 1.

Reference will now follow to FIG. 2 in describing water injector 45 with an understanding that water injector 47 may include similar structure. Water injector 45 includes a body 60 having a first end 62, a second end 63, and an intermediate portion 64 extending therebetween. A conduit 68 extends through body 60 from first end 62 to second end 63. Water injector 45 includes a mounting plate 70 arranged at first end 62. Mounting plate 70 includes a plurality of openings, one of which is indicated at 72, which receive mechanical fasteners (not shown) that secure water injector 45 to ram air header 12. A sealing gasket 74 is arranged at mounting plate 70. Sealing gasket 74 restricts leakage from ram air header 12.

Water injector 45 also includes a spray nozzle 80 arranged at second end 63. Spray nozzle 80 includes a threaded portion 82 that engages with a threaded section 83 formed at second end 63. Spray nozzle 80 includes an orifice 85 having an outlet 87. Outlet 87 includes a diameter of less than about 0.120-inches (3.05-mm). As such, outlet 87 may clog in the event debris may be carried in water from water collector 39. In accordance with an exemplary embodiment, water injector 45 includes a filter 94 arranged at first end 62. Filter 94 includes a filter body 97 having a threaded zone 99 that engages with a threaded section 100 at first end 62. Filter 94 also includes an inlet 104, an outlet 106, and an amount of filter media 110 arranged therebetween. Inlet 104 connects with fluid line 50 to receive water from water collector 39. The water passes through filter media 110 and through outlet 87 of orifice 85 to be sprayed onto ram air heat exchanger 10. The addition of filter media 110 reduces clogs at orifice 85. Further, filter 94 is easily accessed for service and replacement.

While the invention has been described with reference to an exemplary embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the claims.

What is claimed is:

1. A ram air heat exchanger comprising:
   a ram air outlet;
   a ram air header including a ram air inlet; and
   a water injector mounted to the ram air header, the water injector comprising:
   a body having a first end, a second end, and an intermediate portion extending therebetween;
   a conduit extending through the body from the first end to the second end;
   a spray nozzle fluidically connected to the conduit arranged at one of the first end and the second end, the spray nozzle threadingly connected to the body in a repeatedly removable manner;
   a mounting plate arranged at the other of the first end and the second end, the mounting plate being configured and disposed to secure the body to an aviation cooling component; and
   a filter supported at the body and fluidically exposed to the conduit, the filter being configured and disposed to capture particulate flowing into the water injector towards the spray nozzle, the filter threadingly engaged in the other of the first end and the second end in a repeatedly removable manner.

2. The ram air heat exchanger according to claim 1, wherein the spray nozzle includes an orifice having an outlet of less than about 0.120-inches (3.05-mm).

3. The ram air heat exchanger according to claim 1, further comprising: a sealing gasket arranged at the mounting plate, the sealing gasket being configured and disposed to seal an interface between the water injector and the aviation cooling component.

* * * * *